(12) United States Patent
Kerssemakers et al.

(10) Patent No.: US 12,007,699 B2
(45) Date of Patent: Jun. 11, 2024

(54) VESSEL FOR A RADIATION SOURCE

(71) Applicant: ASML Netherlands B.V., Veldhoven (NL)

(72) Inventors: Sander Kerssemakers, Eindhoven (NL); Robert Gabriël Maria Lansbergen, Schiedam (NL); Martinus Hendrikus Antonius Leenders, Rhoon (NL); Henricus Gerardus Tegenbosch, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/787,235

(22) PCT Filed: Nov. 13, 2020

(86) PCT No.: PCT/EP2020/082053
§ 371 (c)(1),
(2) Date: Jun. 17, 2022

(87) PCT Pub. No.: WO2021/121814
PCT Pub. Date: Jun. 24, 2021

(65) Prior Publication Data
US 2023/0023631 A1    Jan. 26, 2023

Related U.S. Application Data

(60) Provisional application No. 62/948,911, filed on Dec. 17, 2019.

(51) Int. Cl.
*G03F 7/20* (2006.01)
*G03F 7/00* (2006.01)
*H05G 2/00* (2006.01)

(52) U.S. Cl.
CPC ...... *G03F 7/70841* (2013.01); *G03F 7/70033* (2013.01); *G03F 7/70975* (2013.01); *H05G 2/005* (2013.01); *H05G 2/008* (2013.01)

(58) Field of Classification Search
CPC ............ G03F 7/70841; G03F 7/70033; G03F 7/70975; G03F 7/70808; G03F 7/70925; H05G 2/005; H05G 2/008
See application file for complete search history.

(56) References Cited

U.S. PATENT DOCUMENTS 10,057,972 B2 *   8/2018   Ueno .................... H01L 21/027
2005/0057827 A1   3/2005   Miyachi et al.
(Continued)

FOREIGN PATENT DOCUMENTS

DE        102017212352 A1    7/2018

OTHER PUBLICATIONS

International Search Report and Written Opinion of the International Searching Authority directed to related International Patent Application No. PCT/EP2020/082053, dated Mar. 11, 2021; 13 pages.

(Continued)

*Primary Examiner* — Mesfin T Asfaw
(74) *Attorney, Agent, or Firm* — Sterne, Kessler, Goldstein & Fox P.L.L.C.

(57) ABSTRACT

A vessel (16) for an EUV radiation source, the vessel comprising a first opening (30) for accessing an interior (32) of the vessel, a first access member (34) configured to allow or prevent access to the interior of the vessel through the first opening, a second opening (36) for accessing the interior of the vessel, the second opening being arranged in the first access member and a second access member (38) arranged (Continued)

on the first access member and configured to allow or prevent access to the interior of the vessel through the second opening.

15 Claims, 7 Drawing Sheets

(56) References Cited

U.S. PATENT DOCUMENTS

| | | |
|---|---|---|
| 2006/0175558 A1 | 8/2006 | Bakker et al. |
| 2008/0104828 A1 | 5/2008 | Someya et al. |
| 2012/0140196 A1 | 6/2012 | Banine et al. |
| 2014/0131587 A1 | 5/2014 | Watanabe et al. |
| 2014/0166046 A1 | 6/2014 | Asayama et al. |
| 2016/0187787 A1 | 6/2016 | Nishisaka et al. |
| 2018/0103534 A1* | 4/2018 | Saito .................... H05G 2/008 |
| 2019/0320521 A1 | 10/2019 | Takayama |
| 2020/0045802 A1 | 2/2020 | Hayashi |

OTHER PUBLICATIONS

International Preliminary Report on Patentability directed to related International Patent Application No. PCT/EP2020/082053, dated May 17, 2022; 9 pages.

* cited by examiner

Operating the first access member to allow access to the interior of the vessel through the first opening (705)

Removing at least the first component to be exchanged (710)

Installing at least another first component to be used (715)

Operating the first access member to prevent access to the interior of the vessel through the first opening (720)

FIG. 6

```
┌─────────────────────────────────────────────────────────────┐
│ Operating the second access member to allow access to the   │
│ interior of the vessel through the second opening           │
│                                                             │
│                         (805)                               │
└─────────────────────────────────────────────────────────────┘
                              ⇩
┌─────────────────────────────────────────────────────────────┐
│       Removing the second component to be exchanged         │
│                                                             │
│                         (810)                               │
└─────────────────────────────────────────────────────────────┘
                              ⇩
┌─────────────────────────────────────────────────────────────┐
│         Installing another second component to be used      │
│                                                             │
│                         (815)                               │
└─────────────────────────────────────────────────────────────┘
                              ⇩
┌─────────────────────────────────────────────────────────────┐
│ Operating the second access member to prevent access to the │
│ interior of the vessel through the second opening           │
│                                                             │
│                         (820)                               │
└─────────────────────────────────────────────────────────────┘
```

FIG. 7

VESSEL FOR A RADIATION SOURCE

CROSS-REFERENCE TO RELATED APPLICATIONS

This application claims priority of U.S. application 62/948,911 which was filed on Dec. 17, 2019 and which is incorporated herein in its entirety by reference.

FIELD

The present invention relates to a vessel for a radiation source, such as an extreme ultraviolet (EUV) radiation source, and associated apparatuses, systems and methods.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features, which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

The lithographic apparatus may be part of the lithographic system, which may also comprise a radiation source. The EUV radiation may be produced using a plasma. The plasma may be created, for example, by directing a laser beam at a fuel in the radiation source. The resulting plasma may emit the EUV radiation. A portion of the fuel may become fuel debris, which may accumulate on one or more components of the radiation source.

Although the radiation source may comprise a debris mitigation system, which may be configured to reduce the deposition of fuel debris on the components of the radiation source, there may be still some components of the radiation source that require replacement, e.g. due to fuel debris deposition. Additionally or alternatively, some components of the radiation source may become defective and therefore, may require replacement.

Such components may be arranged in the interior of the radiation source and difficult to access. Therefore, their replacement may be very time consuming, requiring a large number of steps and/or specialist tools. Every step needed for the replacement of these components may carry the risk of damage to one or more components or parts of the radiation source and/or the tools used. The replacement of these components may lead to a significant down-time of the lithographic apparatus and/or result in high service or maintenance costs.

SUMMARY

According to a first aspect of the present invention there is provided a vessel for a radiation source, such as an EUV radiation source, the vessel comprising a first opening for accessing an interior of the vessel, a first access member configured to allow or prevent access to the interior of the vessel through the first opening, a second opening for accessing the interior of the vessel, the second opening being arranged in the first access member and a second access member arranged on the first access member and configured to allow or prevent access to the interior of the vessel through the second opening.

The arrangement of the second access member on the first access member may allow for a compact arrangement of the vessel, e.g. the first and second access members. Additionally or alternatively, the arrangement of the second access member on the first access member may facilitate access to the interior of the vessel and/or allow for an increased size or dimension of the first opening, e.g. relative to an arrangement where the second access member is provided separately from the first access member.

The arrangement of the first access member and the second access member may allow for unobstructed access to the interior of the vessel. This may improve access to the interior of the vessel. The improved access to the interior of the vessel may result in a reduction in a number of steps that may be necessary for exchanging one or more components of the radiation source. For example, removal of a component or part, which may be arranged adjacent or in front of the vessel may not be necessary. Additionally or alternatively, movement of the vessel e.g. to access the interior of the vessel, may not be necessary. This may lead to a decrease in the time and/or personnel needed for exchanging the one or more components of the radiation source.

The first opening may be configured to allow access to a first component of the radiation source. The first opening may be configured to allow access to a second component of the radiation source. The first opening may be configured to allow passage of the first and/or second components of the radiation source through the first opening.

The second opening may be configured to allow access to the second component of the radiation source. The second opening may be configured to allow passage of the second component of the radiation source through the second opening.

The vessel may be operable between at least two of a closed configuration, a first open configuration and a second open configuration.

In the closed configuration of the vessel, the first and second access members may be configured to prevent access to the interior of the vessel. In the first open configuration of the vessel, the first access member may be configured to allow access to the interior of the vessel through the first opening. In the second open configuration of the vessel, the second access member may be configured to allow access to the interior of the vessel through the second opening.

The vessel may comprise a mounting portion for mounting one or more metrology modules or inspection apparatuses to the vessel. The mounting portion may be part of or comprised in the first access member. Therefore, removal of the one or more metrology modules or inspection apparatuses, e.g. to access the second component of the radiation source, may not be necessary. This may lead to a decrease in the time and/or the number of steps needed for exchanging the second component of the radiation source. It has been found that the reduction in steps may also lead to a reduction in the risk of damage to the one or more components of the radiation source, the vessel and/or the tools used for the exchange of the second component of the radiation source.

The mounting portion may configured to mount the one or more metrology modules or inspection apparatuses relative to a reference point in the interior of the vessel.

The second access member may be arranged separately from the mounting portion. The second access member may be arranged below the mounting portion.

According to a second aspect of the present invention there is provided a vessel for a radiation source, such as an EUV radiation source, the vessel comprising an opening for accessing an interior of the vessel, and an access member configured to allow or prevent access to the interior of the vessel through the opening, wherein the access member comprises a mounting portion for mounting one or more metrology modules or inspection apparatuses to the vessel.

The vessel may be operable between a closed configuration and an open configuration.

In the closed configuration of the vessel, the access member may be configured to prevent access to the interior of the vessel. In the open configuration of the vessel, the access member may be configured to allow access to the interior of the vessel through the opening.

The vessel of the second aspect may comprise any of the features of the vessel of the first aspect.

According to a third aspect of the present invention there is provided a radiation source, such as an EUV radiation source, comprising a vessel according to the first aspect and/or the second aspect.

The radiation source may comprise a debris mitigation system. The debris mitigation system may be configured to be modular.

The radiation source may comprise a first component. The first component of the radiation source may comprise at least a part or all of the debris mitigation system of the radiation source.

The radiation source may comprise a second component. The second component of the radiation source may comprise at least one of a collector mirror for collecting radiation emitted at a plasma formation region of the radiation source, and a fuel collector for collecting fuel debris generated at the plasma formation region of the radiation source.

According to a fourth aspect of the present invention there is provided a lithographic system comprising a radiation source according to the third aspect and a lithographic apparatus.

According to a fifth aspect of the present invention there is provided a method of exchanging at least a first component of a radiation source, such as an EUV radiation source, the radiation source comprising a vessel according to the first aspect, the method comprising operating the first access member to allow access to the interior of the vessel through the first opening, removing at least the first component to be exchanged, installing at least another first component to be used and operating the first access member to prevent access to the interior of the vessel through the first opening.

According to a sixth aspect of the present invention there is provided a method of exchanging a second component of a radiation source, such as an EUV radiation source, the radiation source comprising a vessel according to the first aspect, the method comprising operating the second access member to allow access to the interior of the vessel through the second opening, removing the second component to be exchanged, installing another second component to be used and operating the second access member to prevent access to the interior of the vessel through the second opening.

According to a seventh aspect of the present invention there is provided a method of exchanging a first component and/or a second component of a radiation source, such as an EUV radiation source, the radiation source comprising a vessel according to the second aspect, the method comprising operating the access member to allow access to the interior of the vessel through the opening, removing the first component and/or second component to be exchanged, installing another first component and/or second component to be used and operating the access member to prevent access to the interior of the vessel through the opening.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings, in which:

FIG. 6 depicts a flowchart outlining the steps of a method of exchanging at least a first component of a radiation source; and FIG. 7 depicts a flowchart outlining the steps of a method of exchanging a second component of a radiation source.

DETAILED DESCRIPTION

Figure 1:
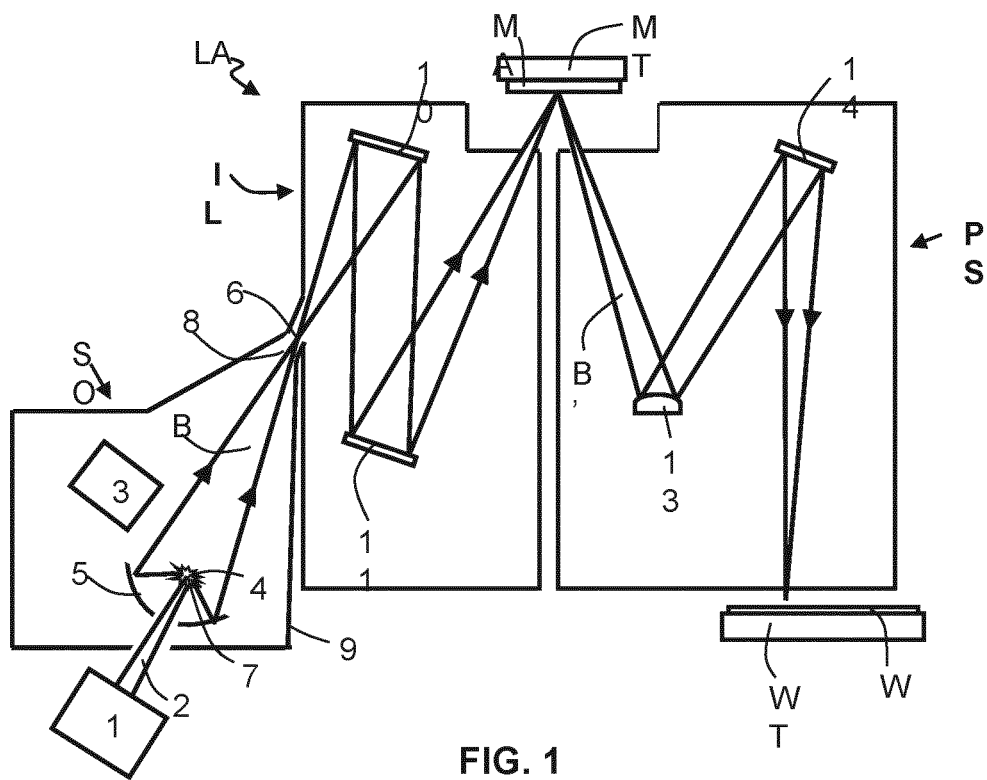
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a faceted field mirror device 10 and a faceted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g., six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO shown in FIG. 1 is, for example, of a type which may be referred to as a laser produced plasma (LPP) source. A laser system 1, which may, for example, include a CO2 laser, is arranged to deposit energy via a laser beam 2 into a fuel, such as tin (Sn) which is provided from, e.g., a fuel emitter 3. Although tin is referred to in the following description, any suitable fuel may be used. The fuel may, for example, be in liquid form, and may, for example, be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma.

The EUV radiation from the plasma is collected and focused by a collector 5. Collector 5 comprises, for example, a near-normal incidence radiation collector 5 (sometimes referred to more generally as a normal-incidence radiation collector). The collector 5 may have a multilayer mirror structure, which is arranged to reflect EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below.

The laser system 1 may be spatially separated from the radiation source SO. Where this is the case, the laser beam 2 may be passed from the laser system 1 to the radiation source SO with the aid of a beam delivery system (not shown) comprising, for example, suitable directing mirrors and/or a beam expander, and/or other optics. The laser system 1, the radiation source SO and the beam delivery system may together be considered to be a radiation system.

Radiation that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The radiation source SO is arranged such that the intermediate focus 6 is located at or near to an opening 8 in an enclosing structure 9 of the radiation source SO.

Figure 2:
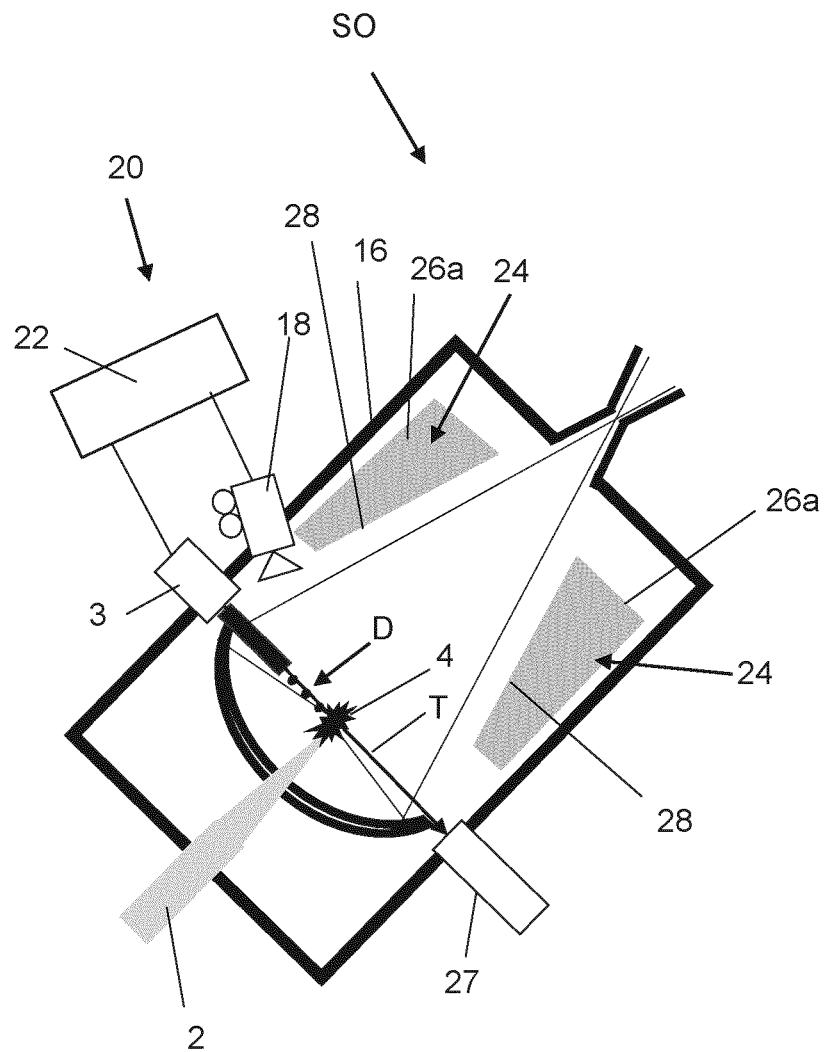
FIG. 2 depicts the radiation source of FIG. 1 in more detail.

FIG. 2 shows the radiation source of FIG. 1 in more detail. The radiation source SO may comprise a vessel 16. The enclosing structure 9, which is shown in FIG. 1, may be defined by or comprised in the vessel 16. The term "vessel" may be considered as encompassing a vacuum vessel, pressure vessel, vacuum chamber or pressure chamber or the like. In other words, the vessel 16 may be considered as providing an enclosure to a vacuum or low pressure environment of the radiation source SO. Expressed differently, a pressure in the vessel 16 may be below atmospheric pressure. The vessel 16 may be configured to enclose one or more components of the radiation source SO, such as for example the collector 5. It will be appreciated that the vessel may be configured to enclose additional components of the radiation source SO, as will be described below. The vessel 16 may comprise a modular vessel.

The radiation source SO may comprise one or more metrology modules or inspection apparatuses. The metrology modules or inspection apparatuses will be referred to in the following description as inspection apparatuses 18, one of which is shown in FIG. 2. The inspection apparatuses 18 may be mounted on the vessel 16 or part thereof. The inspection apparatuses 18 may be positioned on the vessel with a high precision, e.g. using one or more kinematic mount.

At least one of the inspection apparatuses 18 may be part of a fuel droplet steering system 20, which comprises a controller 22 and the fuel emitter 3. The inspection apparatus 18 may be configured to determine a position of the fuel droplets D in the vessel 16, e.g. relative to the plasma formation region 4. The inspection apparatus 18 may be in communication with the controller 22. The controller 22 may be configured to control the fuel emitter 3. For example, in response to a determination made by the inspection apparatuses 18, the controller 22 may control the fuel emitter 3, for example to adjust a fuel droplet release time and/or a fuel droplet release direction to control the trajectory T of the fuel droplets D towards the plasma formation region 4.

It will be appreciated that the radiation source SO may comprise at least one other inspection apparatus (not shown in FIG. 2). The other inspection apparatus may be configured to determine a position of the laser beam relative to plasma formation region. For example, in response to a determination made by the other inspection apparatus, a position of the laser beam relative to the plasma formation region may be adjusted or controlled, e.g. using the controller 22 or another controller. The controller 22 or other controller may be configured to be in communication with the laser system 1 and/or the beam delivery system.

The one or more inspection apparatuses 18 may be provided in the form of a droplet detection module (DDM), a line laser module (LLM), a droplet illumination module (DIM), a droplet formation camera (DFC), a coarse droplet steering camera (CDSC) and/or a fine droplet steering camera (FDSC) or the like. The one or more inspection apparatuses 18 may comprise a pair of droplet formation cameras. The one or more inspection apparatuses 18 may comprise an illumination module, such as for example a backlight laser module (BLM). The backlight laser module may be connected to the pair of droplet formation cameras or to the/each droplet formation camera.

The radiation source SO may comprise a debris mitigation system 24, a part of which is shown in FIG. 2. The debris mitigation system 24 may be configured to reduce fuel debris in the radiation source SO. Fuel debris may be emitted from the plasma formation region 4 of the radiation source SO. Fuel debris may include particulate debris, such as for example Sn clusters, Sn microparticles, Sn nanoparticles, and/or Sn deposits, molecular and/or atomic debris, such as for example Sn vapor, SnHx vapor, Sn atoms, Sn ions, e.g. when tin is used as a fuel.

The debris mitigation system 24 may comprise a contamination trap 26a. The contamination trap 26a may be arranged so as to surround the plasma formation region 4. The contamination trap 26a may comprise a plurality of vanes 28. The plurality of vanes 28 may be configured to trap fuel debris emitted from the plasma formation region 4 of the radiation source SO. Although FIG. 2 shows only the contamination trap 26a, it will be appreciated that the debris mitigation system 24 may comprise one or more other components, as will be described below.

The radiation source SO may comprise a first fuel collector 27. The fuel collector may be configured to collect a part of the fuel that passes through the plasma formation region 4 without being converted to radiation emitting plasma. The fuel collector 27 may be arranged on the trajectory T of the droplets D in the radiation source SO. The fuel collector 27 may comprise a receptacle, bucket, container or the like (not shown). The first fuel collector 27 and/or the receptacle or container may be arranged outside the vessel 16. The debris mitigation system 24 may be configured to direct a plurality of gas flows in a plurality of directions in the radiation source SO, e.g. to reduce deposition or accumulation of fuel debris on the components in the radiation source SO, such as for example the collector 5.

The radiation source SO may comprise a fuel debris collection system (not shown). The fuel debris collection system may be part of the debris mitigation system 24. The fuel debris collection system may comprise a second fuel collector in the form of a receptacle, bucket, container or the like, to collect fuel debris generated at the plasma formation region 4 of the radiation source SO.

The debris mitigation system 24 may be configured to be modular. This may facilitate the installation of the debris mitigation system 24, e.g. one or more parts thereof, in the radiation source SO, replacement of one or more parts of the debris mitigation system 24 and/or modification of one or more parts of the debris mitigation system 24. The debris mitigation system may comprise a gas flow device 26f (shown in FIG. 3B) arranged between the collector 5 and the contamination trap 26a and configured to direct a gas flow towards the centre of the gas flow device.

Figure 3A:
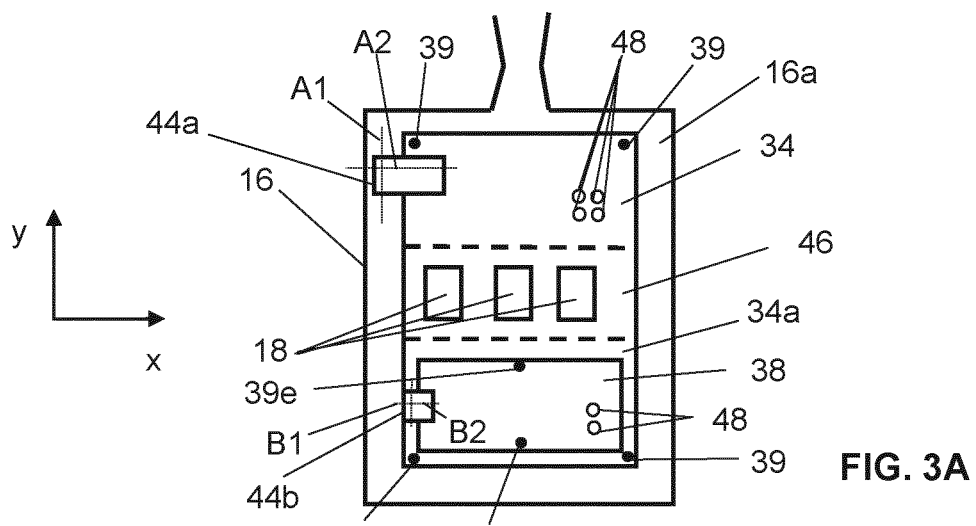
FIGS. 3A to 3C depict an exemplary vessel for use with the radiation source of FIGS. 1 to 2.
Figure 3B:
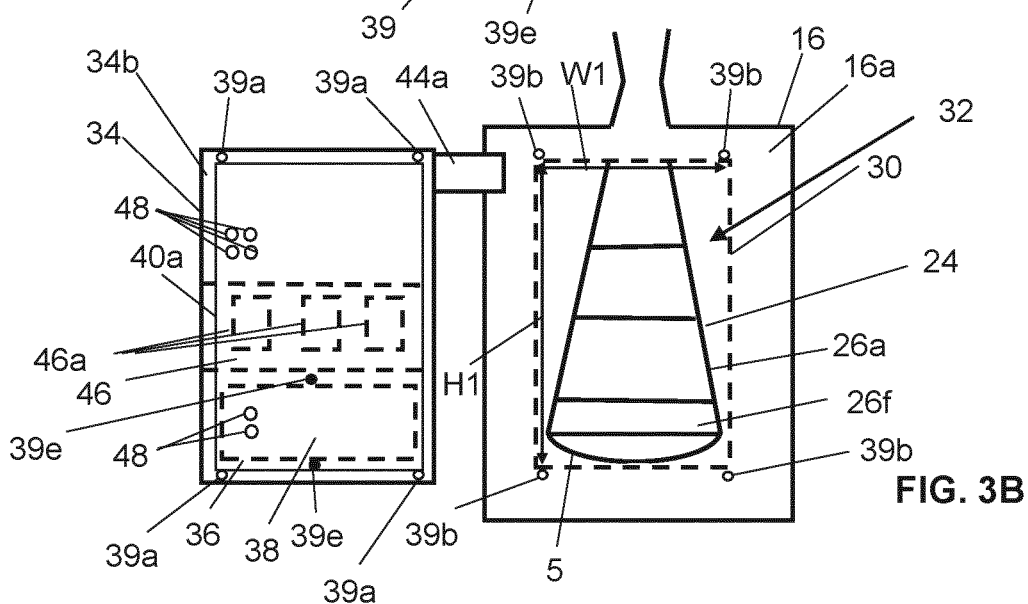
Figure 3C:
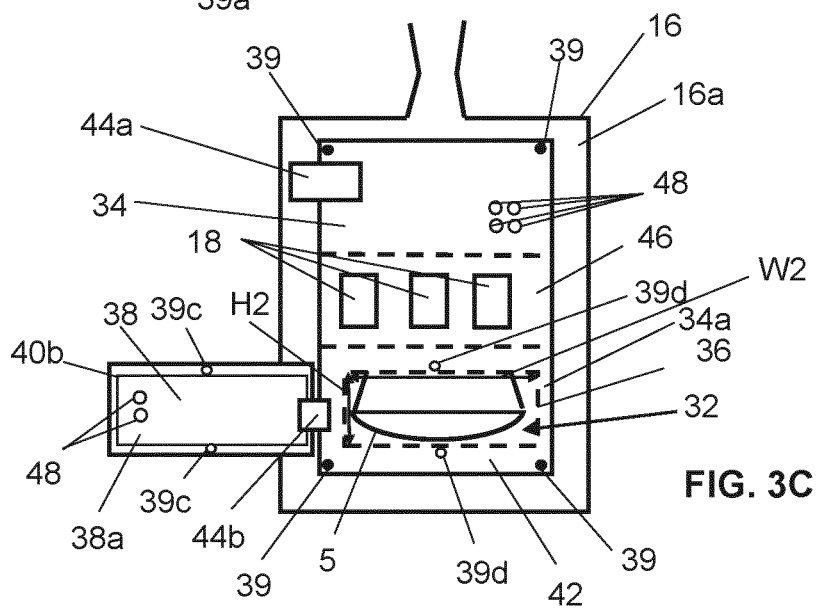

FIGS. 3A to 3C show an exemplary vessel 16 for use with the radiation source shown in FIGS. 1 to 3. The vessel 16 comprises a first opening for accessing an interior 32 of the vessel 16. The first opening 30 is indicated in FIG. 3B by the dashed line. One or more components of the radiation source SO, such as for example the collector 5, the second fuel collector 29a and the debris mitigation system 24, may be arranged in the interior 32 of the vessel 16, as described above. The vessel 16 comprises a first access member 34. The first access member 34 is configured to allow or prevent access to the interior 32 of the vessel 16 through the first opening 30. The first access member 34 may be provided in the form of a hatch, door, lid or the like.

The vessel 16 comprises a second opening 36 for accessing the interior 32 of the vessel 16. The second opening 36 is indicated in FIG. 3C by the dashed line. The second opening 36 is arranged in the first access member 34. Expressed differently, the second opening 36 is part of or comprised in the first access member 34. The vessel 16 comprises a second access member 38. The second access member 38 is arranged on the first access member 34. For example, the second access member 38 may be arranged on a surface 34a, e.g. an outer surface, of the first access member 34. The second access member 38 may be part of or comprised in the first access member 34. The second access member 38 may be provided in the form of another hatch, door, lid or the like. The second access member 38 is configured to allow or prevent access to the interior 32 of the vessel 16 through the second opening 36. The arrangement of the second access member 38 on the first access member 34 and/or as part of the first access member 34 may allow for a compact arrangement of the vessel 16, e.g. the first and second access members 34, 38. Additionally or alternatively, the arrangement of the second access member 38 on the first access member 34 may facilitate access to the interior 32 of the vessel 16 and/or allow for an increased size or dimension of the first opening 30, e.g. relative to an arrangement where the second access member is provided separately from the first access member.

As can be seen in FIGS. 3A to 3C, a size or dimension of the first opening 30 is larger than a size or dimension of the second opening 36. A size or dimension of the first access member 34 is larger than a size or dimension of the second access member 38. This may allow for access to different components of the radiation source SO. It will be appreciated that the size or dimension of the first access member 34 may be larger than the size or dimension of the first opening 30. The size or dimension of the second access member 38 may be larger than the size or dimension of the second opening 36. The first opening 30 may be configured to allow access to a first component of the radiation source SO. The first opening 30 may be configured to also allow access to a second component of the radiation source SO. In this embodiment, the first component may comprise at least a part or all of the debris mitigation system 24. The second component may comprise the collector 5 and/or the second fuel collector. By configuring the first opening 30 to allow access to a part or all of the debris mitigation system 24, one or more components or parts of the debris mitigation system 24, such as for example the contamination trap 26a may be exchanged without the need to move or shift the vessel 16. This may facilitate the exchange of the part or all of the debris mitigation system 24, reduce a time and/or a number of steps needed for exchanging the part or all of the debris mitigation system 24.

The first opening 30 may be configured to allow passage of the part or all of the debris mitigation system 24 and/or the collector 5 through the first opening 30. Expressed differently, the size or dimension of the first opening 30 may be selected so as to allow passage of the part or all of the debris mitigation system 24 and/or the collector 5 through the first opening 30. For example, the first opening 30 may comprise a height H1 of about 0.85 m and/or a width W1 of about 1 m. The first opening 30 may be arranged on a wall 16a, such as for example lateral or side wall of the vessel 16.

The second opening 36 may be configured to allow access to the second component of the radiation source SO, e.g. the collector 5, the gas flow device 26f, and/or the second fuel collector.

The second opening 36 may be configured to allow passage of the collector 5 and/or the second fuel collector 29a through the second opening 36. Expressed differently, the size or dimension of the second opening 36 may be selected so as to allow passage of the collector 5 and/or the second fuel collector through the second opening 36. For example, the second opening may comprise a height H2 of about 0.25 m and a width W2 of about 0.8 m. A position of the second opening 36 in the first access member 34 may be selected based on a position of the collector 5 and/or the second fuel collector 29a in the radiation source SO.

The vessel 16 may be operable between at least two of a closed configuration, a first open configuration and a second open configuration. In the closed configuration of the vessel 16, which is shown in FIG. 3A, the first and second access members 34, 38 are configured to prevent access to the interior 32 of the vessel 16. In other words, the first and second access members 34, 38 are closed and block the first and second openings 30, 36, respectively. In the closed configuration of the vessel 16, the first access member 34 may be fastened to the wall 16a of the vessel 16, e.g. using a fastening arrangement. The fastening arrangement may comprise a plurality of fasteners 39, such as for example screws or bolts or the like, four of which are shown in FIG. 3A. The fastening arrangement may comprise a plurality of bores 39a, 39b. The bores 39a, 39b may be arranged in the first access member 34 and the vessel 16, e.g. the wall 16a of the vessel 16, so as to allow the first access member 34 to be fastened to the wall 16a of the vessel 16, e.g. using the fasteners 39. In the embodiment shown in FIGS. 3B and 3C, four bores 39a are arranged on a periphery of the first access member 34 and four respective bores 39b are arranged on a periphery of the first opening 30. It will be appreciated that in other embodiments, the first access member and/or the wall of the vessel may comprise more or less than four bores. It will also be appreciated that in other embodiments more or less than four fasteners may be used.

The fastening arrangement may comprise a plurality of further bores 39c, 39d. The further bores 39c, 39d may be arranged in the second access member 38 and the first access member 34, e.g. a wall 42 of the first access member 34. It will be appreciated that the wall 42 of the first access member 34 may comprise the surface 34a of the first access member 34. The bores 39c, 39d may be arranged in the second access member 38 and the first access member 34, e.g. the wall 42 of the first access member 34, so as to allow the second access member 38 to be fastened to the wall 42 of the first access member 34, e.g. using further fasteners 39e. In the embodiment shown in FIGS. 4A to 4C, two further bores 39c are arranged on a periphery of the second access member 34 and two respective bores 39d are arranged on a periphery of the second opening 36. It will be appreciated that in other embodiments, the second access member and/or the first access member may comprise more or less than two further bores.

The vessel 16 may be configured such that an interior 32 of the vessel 16 is sealed off by the first and/or second access members 34, 38. The first access member 34 may be configured to allow for a seal to be formed between the first access member 34 and the vessel 16. For example, the vessel 16 may comprise one or more sealing elements. A first sealing element 40a may be arranged on the first access member 34, e.g. on another surface 34b, e.g. an interior surface 34b, of the first access member 34. The first access member 34 may be configured such that at least a part of the other surface 34b of the first access member 34 abuts or contacts a part of the wall 16a of the vessel 16, e.g. when the vessel 16 is in the closed configuration. The first access member 34 may be configured such that the surface 34a and other surface 34b oppose each other.

The second access member 38 may be configured to allow for another seal to be formed between the first access member 34 and the second access member 38. In other words, the second access 38 member may be configured to form the other seal with the wall 42, e.g. a part thereof, of the first access member 34. A second sealing element 40b may be arranged on the second access member 38, e.g. to allow the other seal being formed between the second access member 38 and the first access member 34. The second sealing element may be arranged on a surface 38a, e.g. an interior surface, of the second access member 38. The second access member 38 may be configured such that at least a part of the surface 38a of the second access member 38 abuts or contacts a part of the wall 42 and/or surface 34a of the first access member 34, e.g. when the vessel 16 is in the closed configuration.

In the first open configuration of the vessel 16, which is shown in FIG. 3B, the first access member 34 is configured to allow access to the interior 32 of the vessel 16 through the first opening 30. Expressed differently, the first access member 34 may be open and the first opening 30 may be unblocked. However, the second access member 38 may be closed and the second opening 36 may be blocked. The vessel 16 may be operated into the first open configuration by unfastening and/or removing of the fasteners 39 from the bores 39a, 39b of the first access member 34 and the vessel 16.

In the second open configuration of the vessel 16, which is shown in FIG. 3C, the second access member 38 is configured to allow access to the interior 32 of the vessel 16 through the second opening 36. In other words, the first access member 34 may be closed, the second access member 38 may be open and the second opening 36 may be unblocked. The vessel 16 may be operated into the second open configuration by unfastening and/or removing of the further fasteners 39e from the further bores 39c, 39d of the second access member 38 and the first access member 34.

By configuring the vessel 16 to be operable between the at least two of the closed configuration, the first open configuration and the second open configuration, access to the interior 32 of the vessel 16 or parts thereof may be facilitated, e.g. to allow for exchanging of one or more components of the radiation source SO, such as the collector 5, the second fuel collector 29a and/or the part or all of the debris mitigation system 24.

The vessel 16 may comprise one or more connection members, such as for example first and/or second connection members 44a, 44b. The first connection member 44a may be configured to connect the first access member 34 to the vessel 16, e.g. the wall 16a. The second connection member 44b may be configured to connect the second access member 38 to the first access member 34. The first and second connection members 44a, 44b may be each provided in the form of a hinge, pivot mechanism, joint mechanism or the like. The first and/or second connection members 44a, 44b may be configured to allow for operation of the vessel 16 between at least two of the closed configuration of the vessel 16, the first open configuration of the vessel 16 and the second open configuration of the vessel 16.

The first connection member 44a may be configured to allow for rotation of the first access member 34 around a first axis A1, e.g. when the vessel 16 is operated from the closed configuration to the first open configuration. The first connection member 44a may be configured to allow for rotation of the first access member 34 around a second axis A2, e.g. when the vessel 16 is operated from the closed configuration to the first open configuration. Expressed differently, the first connection member 44a may be configured such that first access member 34 is rotatable or pivotable around the first axis A1 and the second axis A2. The first and second axes A1, A2 are indicated in FIG. 3A by the dotted lines. The first connection member 44a may be configured such that the first axis A1 extends in a vertical direction. The vertical direction may be considered as a direction parallel to the y-direction indicated by a coordinate system in FIG. 3A. The first connection member 44a may be configured such that the second axis A2 extends in a direction perpendicular (e.g. substantially perpendicular) to the first axis A1, as shown in FIG. 3A. In other words, the second axis A2 may be considered as extending in a direction parallel to the x-direction indicated by the coordinate system in FIG. 3A. As can be seen from FIG. 2, the radiation source SO may be arranged to extend at an angle relative to the vertical direction. The wall 16a of the vessel 16 or at least a part thereof, on which the first access member 34 is arranged, may extend at the angle relative to vertical direction. As such, the first access member 34 may be considered as being arranged at the angle relative to the vertical direction. The second access member 34 may be considered as extending in the vertical direction.

The first connection member 44a may be configured so that the first access member 34 sequentially rotates around the first axis A1 and the second axis A2 or vice versa, e.g. when the vessel 16 is operated between the closed configuration and the first open configuration. When the vessel 16 is in the first open configuration, the first access member 34 may extend in the vertical direction. This configuration of the first connection member 44a may prevent access to the interior 32 of the vessel 16 being blocked or restricted by the first access member 34, e.g. when the vessel 16 is in the first open configuration.

The first connection member 44a may be configured to compensate, e.g. at least partially compensate, a gravitational force acting on the first access member 34, e.g. when the vessel is operated from the first open configuration to the closed configuration. Expressed differently, the first connection member 44a may be configured to counteract, e.g. at least partially counteract, the gravitational force acting on the first access member 34. The gravitational force may be due to the radiation source SO and/or the first access member 34 being arranged at an angle relative to the vertical direction. By configuring the first connection member 44a to compensate the gravitational force, an impact force acting on the vessel 16, e.g. when the vessel is operated from the first open configuration to the closed configuration, may be reduced or prevented. This in turn may prevent or reduce changes in the alignment of the inspection apparatuses 18. The first connection member 44a may comprise one or more tensioning elements (not shown). The tensioning elements may be provided in the form of one or more springs or resilient elements. The tensioning elements may be configured to compensate, e.g. at least partially compensate, the gravitational force acting on the first access member 34, e.g. when the vessel is operated from the first open configuration to the closed configuration. For example, the tensioning elements may be pre-tensioned. It will be appreciated that the first connection member is not limited to the configuration disclosed herein and that in other embodiments, the first connection member may be differently configured. For example, the first connection member may be configured such that the first access member may be rotatable or pivotable around a single axis, e.g. extending in the vertical direction, or more than two axes.

The second connection member 44b may be configured to allow for rotation of the second access member 38 around a further axis B, e.g. when the vessel 16 is operated from the closed configuration to the second open configuration. Expressed differently, the second connection member 44b may be configured such that second access member 38 is rotatable or pivotable around the further axis B. The further axis B is indicated in FIG. 3A by a dotted line. The second connection member 44b may be configured such that the further axis B extends in the vertical direction. It will be appreciated that the second connection member is not limited to the configuration disclosed herein and that in other embodiments, the second connection member may be differently configured. For example, the second connection member may be configured in the same manner as the first connection member.

The vessel 16 may comprise a mounting portion 46 for mounting the inspection apparatuses 18 to the vessel 16. Although FIG. 3B shows three inspection apparatuses 18 mounted to the vessel 16, it will be appreciated that in other embodiments more or less than three inspection apparatuses may be mounted to the vessel. The mounting portion 46 may be part of or comprised in the first access member 34. By providing the mounting portion 46 as part of first access member 34, removal of the inspection apparatuses prior to operation of the vessel 16 between the closed configuration and the first or second open configuration may not be necessary. This may avoid or decrease the need for alignment of the inspection apparatuses. This in turn may lead to a decrease in time and/or the number of steps required for exchanging one or more components of the radiation source SO, such as for example the collector 5 and/or the part or all of the debris mitigation system 24.

The mounting portion 46 may be configured to mount the inspection apparatuses 18 relative to a reference point in the interior 32 of the vessel 16. For example, the mounting portion 46 may be configured to mount the inspection apparatuses relative to the plasma formation region 4 of the radiation source SO.

The mounting portion 46 may be configured to maintain a position of the inspection apparatuses 18 relative to plasma formation region 4, e.g. subsequent to the operation of the vessel 16 between the closed configuration and the first or second open configuration. In other words, an alignment of the inspection apparatuses 18 relative to the plasma formation region 4 may be maintained during operation of the vessel 16. This may avoid or reduce the need for alignment of the inspection apparatuses 18 relative to the plasma formation region 4.

The mounting portion 46 may comprise one or more recesses or openings 46a, three of which are shown in FIG. 3B. Each recess or opening 46a may be configured for receiving at least a part of a respective inspection apparatus 18. In other words, at least a part of each inspection apparatus 18 may be received in each respective recess or opening 46a so as to at least partially extend into the interior 32 of the vessel 16.

The second access member 38 may be separately arranged or provided from the mounting portion 46, as shown in FIGS. 3A and 3C. In this embodiment, the second access member 38 is arranged below the mounting portion 46. This may allow for direct access to the collector 5 and/or second fuel collector 29a while maintaining the inspection apparatuses 18 in alignment relative to the plasma formation region 4. In other words, the collector 5 and/or second fuel collector 29a may be exchanged without the need of removing the inspection apparatuses 18 prior to accessing the collector 5. This in turn may reduce the time and/or number of steps needed for exchanging the collector 5 and/or the second fuel collector 29a. It will be appreciated that the second access member is not limited to being arranged below the mounting portion. For example, in other embodiments the second access member may be provided at a different position relative to the mounting portion.

The vessel 16 may comprise a plurality of connection elements 48. The plurality of connection element 48 may be configured to provide for connection of a coolant source, gas supply and/or electrical power source to one or more components of the radiation source SO. The connection elements 48 may be configured to pass or transfer the coolant, gas and/or electrical power to the one or more components of the radiation source. Each connection elements may be or comprise a feedthrough element. At least some of the connection elements 48 may be part of the first access member 34. At least some of the connection elements 48 may be part of the second access member 38. Although FIGS. 3A to 3C show four connection elements as being part of the first access member, it will be appreciated that in other embodiments the first access member may comprise more or less than four connection elements. Similarly, the second access member may comprise more or less than two connection elements. Additionally or alternatively, it will be appreciated that in some embodiments only the first access member or only the second access member may comprise one or more connection elements.

In this embodiment, the connection elements 48 may be configured for connection to a coolant source (not shown). The coolant may be provided in the form of a fluid. For example, the coolant may be provided in the form of water. However, it will be appreciated that in other embodiments another coolant fluid, such as for example another coolant liquid or a coolant gas. The connection elements 48 may be configured to allow for connection of the coolant source to the debris mitigation system 24, e.g. the contamination trap 26*a* and/or the collector 5. For example, the connection elements 48, which are part of the first access member 34, may be configured to allow for connection of the coolant source to the debris mitigation system 24, e.g. the contamination trap 26*a*. The connection elements 48, which are part of the second access member 38, may be configured to allow for connection of the coolant source to the collector 5.

The vessel 16 may be made from a metal material. The metal material may be selected to provide sufficient rigidity and/or thermal stability to the vessel 16, e.g. to maintain the inspection apparatuses 18 in alignment. In this embodiment, the metal material may comprise aluminium. This may allow for an improved or required rigidity and/or thermal stability of the vessel 16. Additionally or alternatively, the use of aluminium may allow for the manufacture of the vessel 16 or parts thereof to be facilitated.

Figure 4:
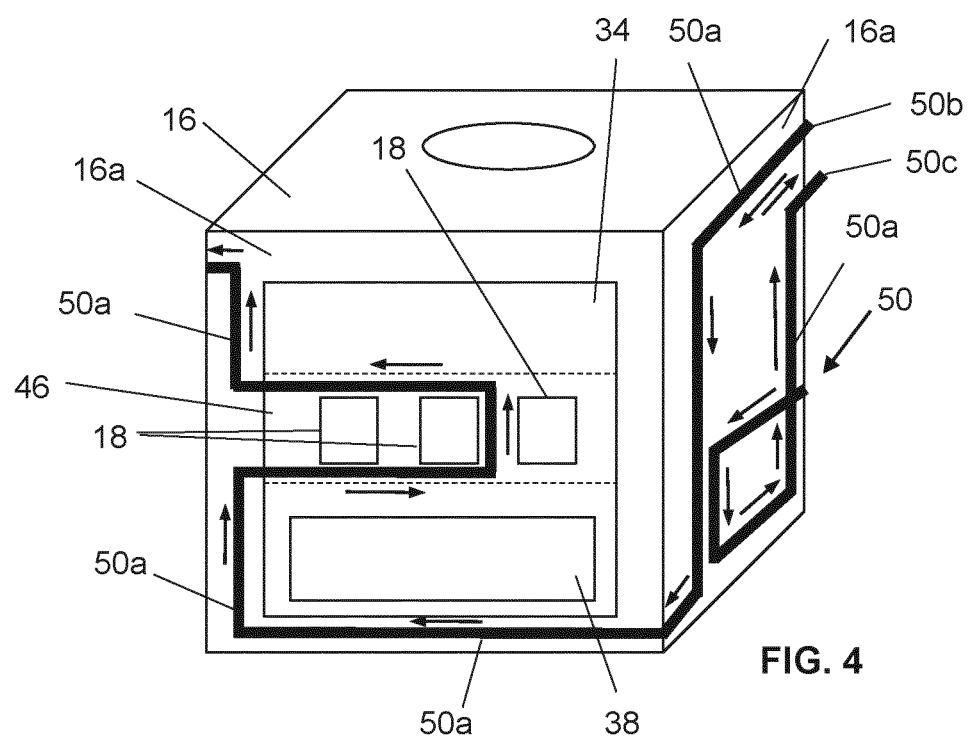
FIG. 4 depicts the vessel of FIGS. 3A to 3C including a cooling arrangement.

FIG. 4 shows another schematic view of the vessel 16 shown in FIG. 3A to 3C. A number of features, which are shown in FIGS. 3A to 3C, have been omitted from FIG. 4 for clarity purposes. However, it will be appreciated that the vessel 16 shown in FIG. 4 may comprise any of the features of the vessel described above in relation to FIG. 3A to 3C. The vessel 16 may comprise a cooling arrangement 50. The cooling arrangement 50 may comprise a plurality of coolant channels 50*a*. The coolant channels 50*a* may be configured for directing a flow of coolant therein. An exemplary flow of the coolant in the coolant channels is indicated by the arrows in FIG. 4. As described above, the coolant may be provided in the form of a fluid. For example, the coolant may be provided in the form of water. However, it will be appreciated that in other embodiments another coolant fluid, such as for example another coolant liquid or a coolant gas.

The vessel 16 may comprise a plurality of walls 16*a*, e.g. a plurality of side or lateral walls, two of which are shown in FIG. 4. The coolant channels 50*a* may be arranged in the walls 16*a* of the vessel 16. For example, the coolant channels 50*a* may be provided in the form of a plurality of yet further bores, e.g. through-bores and/or blind bores, in the walls 16*a* of the vessel 16. The coolant channels 50*a* may be directly formed in the walls 16*a* of the vessel 16. For example, the coolant channels 50*a* may be formed in the walls 16*a* of the vessel 16 using a drilling or cutting process. This may allow for a good thermal contact between the coolant flowing in the coolant channels 50*a* and a material of the vessel 16, e.g. the walls 16*a* of the vessel 16. Although FIG. 4 shows the coolant channels as being arranged in the side or lateral walls of the vessel, it will be appreciated that the vessel disclosed herein is not limited to this arrangement of the coolant channels. For example, one or more further coolant channels may be arranged in a top and/or bottom wall of the vessel.

The coolant channels 50*a* may be arranged to extend along at least a part of each of the walls 16*a* of the vessel 16. It will be appreciated that the arrangement or configuration of the coolant channels 50*a* in the vessel 16 may be selected based on a thermal load acting on the vessel 16, e.g. due to heat emitted from the plasma formation region 4, e.g. during operation of the radiation source SO. It will be appreciated that additionally or alternatively other components or parts of the radiation source SO may emit heat and thereby may contribute to the thermal load acting on the vessel 16.

Some of the coolant channels 50*a* may be part of the first access member 34. For example, as shown in FIG. 4, some of the coolant channels 50*a* may be arranged to extend along at least a part of the mounting portion 46. This may allow for an improved thermal stability of the mounting portion 46. In other words, by arranging some of the coolant channels 50*a* to extend along at least a part of the mounting portion 46, a temperature of the mounting portion 46 may remain constant (e.g. substantially constant), e.g. during operation of the radiation source SO. This may prevent or reduce changes in the alignment of the inspection apparatuses 18, e.g. which may be due to the thermal heat loads acting on vessel 16, e.g. the mounting portion 46. It will be appreciated that in other embodiments, at least some of the coolant channels may be additionally or alternatively be part of the second access member.

The cooling arrangement 50 may comprise an inlet 50*b*. The cooling arrangement 50 may comprise an outlet 50*c*. The cooling arrangement 50 may comprise the coolant source described above. The inlet 50*b* may be connected to the coolant source to supply coolant having a first temperature to the coolant channels 50*a*. The outlet 50*c* may be connected to the coolant source to receive coolant having a second temperature from the coolant channels 50*a*. The second temperature may be higher or larger than the first temperature. It will be appreciated that in other embodiments, the cooling arrangement may comprise another coolant source. It will be appreciated that the cooling arrangement 50 may comprise one or more elements, such as for example one or more flanges or the like, for connecting two or more coolant channels 50*a* together. Additionally or alternatively, the cooling arrangement may comprise one or more further elements, such as for example one or more blind flanges, blind plus, blind covers or the like, for covering or closing a part of all of one or more coolant channels 50*a*. For example, the further elements may be configured to cover or close an end portion of one or more cooling channels 50*a*. The elements and further elements are not shown in FIG. 4 for clarity purposes. It will be appreciated that the vessel disclosed herein is not limited to having a cooling arrangement as shown in FIG. 4. For example, in other embodiments, the coolant channels may be arranged in a different manner and/or the number of coolant channels may be different.

The first access member 34 and the second access member 38 may be arranged on the vessel 16 to provide unobstructed access to the interior 32 of the vessel 16. This may facilitate and/or improve access to the interior 32 of the vessel 16. The improved access to the interior 32 of the vessel 16 may also result in a reduction in the number of steps that are necessary for exchanging the one or more components of the radiation source SO. For example, removal of the beam delivery system and/or movement of the vessel e.g. to access the contamination trap 26*a* of the debris mitigation system 24 and/or other components of the debris mitigation system 24, may not be necessary. This in turn may lead to a decrease in the time and/or personnel needed for exchanging one or more components of the radiation source SO. For example, the time needed for exchanging the contamination trap 26*a* of the debris mitigation system 24 may be reduced by a factor of about 4 or more. Expressed differently, the time needed for exchanging the contamination trap 26*a* may be reduced from about 110 hours to less than 24 hours.

Additionally or alternatively, the first and second access members 34, 38 may allow for the exchange of one or more components of the radiation source SO, e.g. at least a part of the debris mitigation system 24, with alternative or new components of the radiation source. Expressed differently, the first and second access members 34, 38 may allow for the one or more components of the radiation source to be easily modified or exchanged.

Additionally or alternatively, since the first access member 34 may comprise the mounting portion 46, as described above, removal of one or more inspection apparatuses, e.g. to access the collector 5, may not be necessary. Again, this may lead to a decrease in the time and/or the number of steps needed for exchanging the collector 5 of the radiation source SO. For example, the time needed for exchanging the collector 5 may be reduced by a factor of about 5 or more. Expressed differently, the time for exchanging the collector 5 may be reduced from 40 hours to about 8 hours. It has been found that the reduction in steps may also lead to a reduction in the risk of damage to the components of the radiation source SO, the vessel and/or the tools used for the exchange.

Figure 5A:
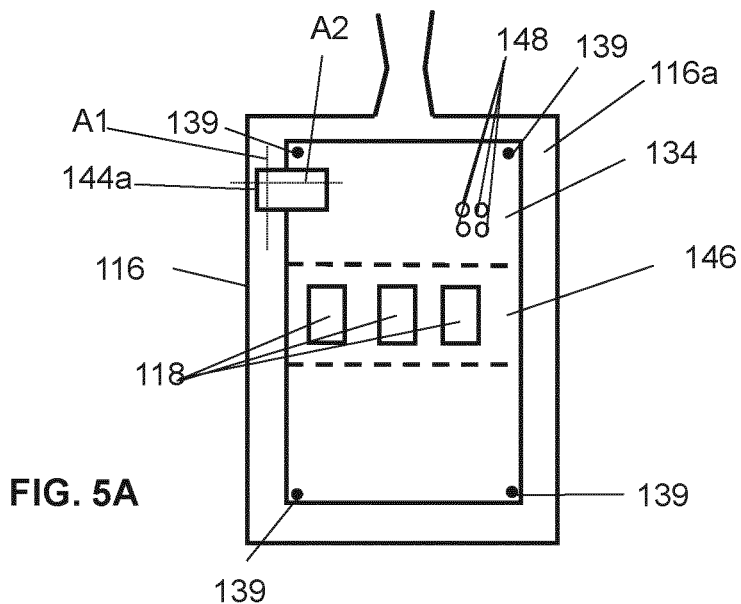
FIGS. 5A and 5B depict another exemplary vessel for use with the radiation source of FIGS. 1 to 2.
Figure 5B:
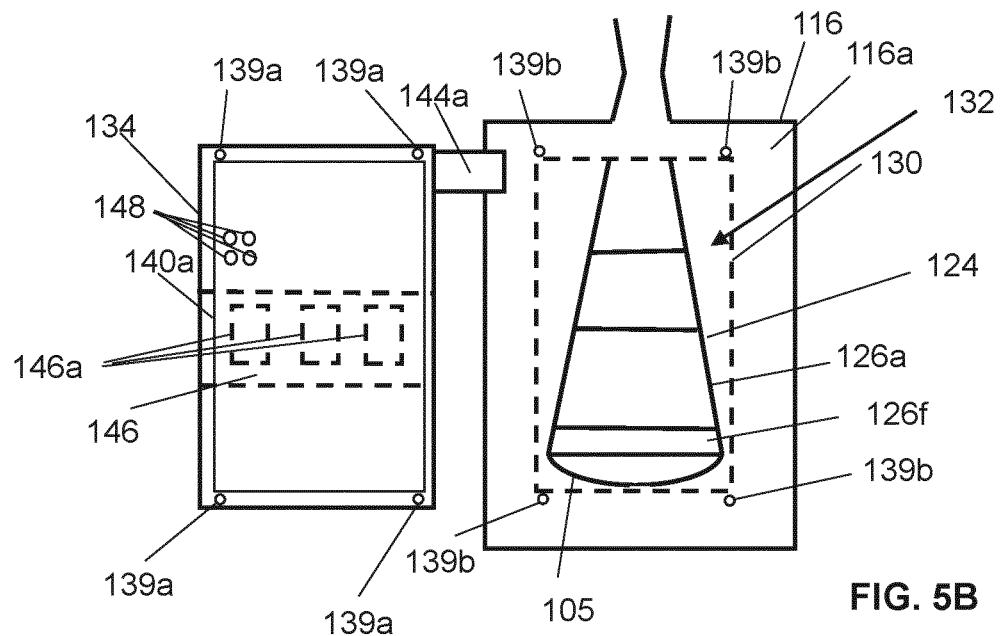

FIGS. 5A and 5B show another exemplary vessel 116 for use with the radiation source SO shown in FIGS. 1 to 3. The vessel 116 shown in FIGS. 5A and 5B is similar to the vessel described above in relation to FIGS. 3A-C and 4. As such, any features described in relation to these may also apply to the vessel shown in FIGS. 5A and 5B. In FIGS. 5A and 5B, like features are indicated by like reference numerals incremented by 100.

As can be seen from FIGS. 5A and 5B, in this embodiment the vessel 16 comprises an opening 130 for accessing an interior 132 of the vessel 116. The vessel 116 comprises an access member 134. The access member 134 may be provided in the form of a hatch, door, lid or the like. The access member 134 may be configured to allow or prevent access to the interior 132 of the vessel 116 through the opening 130. The vessel 116, the opening 130 and/or the access member 134 may comprise any of the features of the vessel 16, the first opening 30 and/or the first access member 34 described above.

The vessel 116 may be operable between a closed configuration and an open configuration. In the closed configuration of the vessel 116, which is shown in FIG. 6A, the access member 134 is configured to prevent access to the interior 132 of the vessel 116. In other words, the access member 134 is closed and blocks the opening 130. In the closed configuration of the vessel 116, the access member 134 may be fastened to the wall 116*a* of the vessel 116, e.g. using a fastening arrangement. The fastening arrangement may comprise one or more fasteners 139, such as for example screws or bolts or the like. The fastening arrangement may comprise a plurality of bores 139*a*, 139*b*. The bores 139*a*, 139*b* may be arranged in the access member 134 and the vessel 116, e.g. the wall 116*a* of the vessel 116, so as to allow the access member 134 to be fastened to the wall 116*a* of the vessel 116, e.g. using the fasteners 139. In the embodiment shown in FIG. 5A, four bores 139*a* are arranged on a periphery of the access member 134 and four respective bores 139*b* are arranged on a periphery of the opening 130. It will be appreciated that in other embodiments, the access member and/or the wall of the vessel may comprise more or less than four bores.

In the open configuration of the vessel 116, which is shown in FIG. 5B, the access member 134 is configured to allow access to the interior 132 of the vessel 116 through the opening 130. Expressed differently, the access member 134 may be open and the opening 130 may be unblocked. The vessel 116 may be operated into the open position by unfastening and/or removing of the fasteners 139 from the bores 139*a*, 139*b* of the access member 134 and the vessel 116.

The access member 134 comprises a mounting portion 146 for mounting one or more metrology modules or inspection apparatuses 118 to the vessel 116. The mounting portion 146 may comprise any of the features of the mounting portion 46 described above in relation to FIGS. 3A-C and 4. By providing the mounting portion 146 as part of access member 134, removal of the inspection apparatuses 118 prior to operation of the vessel 116 between the closed configuration and the open configuration may not be necessary. This may avoid or decrease the need for alignment of the inspection apparatuses. As described above, this in turn may lead to a decrease in time and/or the number of steps required for exchanging one or more components of the radiation source SO, such as for example the collector 105, the second fuel collector (not shown in FIGS. 5A and 5B) and/or the part or all of the debris mitigation system 124.

FIG. 6 shows a flowchart outlining the steps of a method of exchanging at least a first component of an EUV radiation source. The radiation source may comprise the radiation source SO described above. The radiation source may comprise the vessel 16 described in relation to FIGS. 3A-C and 4. In this embodiment, the first component may comprise the contamination trap 26*a* of the debris mitigation system 24. However, it will be appreciated that the method is not limited to exchanging the contamination trap of the debris mitigation system. In other embodiments, the first component may comprise another part or component of the debris mitigation system, such as for example the fuel debris removal device or another component of the radiation source.

The method comprises operating the first access member 34 to allow access to the interior 32 of the vessel 16 through the first opening 30 (step 705). The step (705) of operating the first access member 34 may comprise operating the vessel 16 from the closed configuration, as shown in FIG. 3A, to the first open configuration, as shown in FIG. 3B. The step (705) of operating the first access member 34 may comprise unfastening and/or removing the fasteners 39 from the bores 39*a*, 39*b*. The method may comprise cooling the vessel 16 and/or radiation source SO, e.g. parts thereof, down, e.g. prior to the step (705) of operating the first access member 34. The method may comprise returning the interior 32 of the vessel 16 to atmospheric pressure, e.g. prior to operating the first access member 34. The method may comprise disconnecting the coolant source from the plurality of connection elements 48, which may be part of the first access member 34 and/or the second access member 38, e.g. prior to the step (705) of operating the first access member 34.

In step 710, the method comprises removing the contamination trap 26*a* to be exchanged. The step (710) of removing the contamination trap 26 to be exchanged may comprise disconnecting the contamination trap 26a from at least another part of the debris mitigation system 24 and the gas flow device 26f. The step (710) of removing the contamination trap 26a may comprise passing the contamination trap 26a to be exchanged through the first opening 30.

In step 715, the method comprises installing a contamination trap to be used. The contamination trap to be used may comprise a fresh, cleaned, serviced or new contamination trap.

In step 720, the method comprises operating the first access member 34 to prevent access to the interior 32 of the vessel 16 through the first opening 30. The step (720) of operating the first access member 34 to prevent access may comprise operating the vessel 16 from the first open configuration, as shown in FIG. 3B, to the closed configuration, as shown in FIG. 3A. The step (720) of operating the first access member 34 to prevent access may comprise inserting the fasteners 39 into the bores 39a, 39b and/or fastening the fasteners 39. The method may comprise heating of the vessel 16 and/or radiation source SO, e.g. parts thereof, e.g. subsequent to the step (720) of operating the first access member 34 to prevent access. The method may comprise decreasing a pressure in the interior 32 of the vessel 16 to well below atmospheric pressure, e.g. subsequent to the step (720) of operating the first access member 34 to prevent access. The method may comprise connecting the coolant source to the plurality of connection elements 48, which may be part of the first access member and/or the second access member, e.g. subsequent to the step (720) of operating the first access member to prevent access.

FIG. 7 shows a flowchart outlining the steps of a method of exchanging a second component of an EUV radiation source. The radiation source may comprise the radiation source SO described above. The radiation source SO may comprise the vessel 16 described in relation to FIGS. 3A-C and 4. In this embodiment, the second component may comprise the collector 5 and/or the second fuel collector. However, it will be appreciated that the method is not limited to exchanging the collector 5 and/or the second fuel collector. In other embodiments, the second component may comprise another component of the radiation source SO.

In step 805, the method comprises operating the second access member 38 to allow access to the interior 32 of the vessel 16 through the second opening 36. The step (805) of operating the second access member 38 may comprise operating the vessel 16 from the closed configuration, as shown in FIG. 3A, to the second open configuration, as shown in FIG. 3C. The step (805) of operating the second access member 38 may comprise unfastening and/or removing the further fasteners 39e from the further bores 39d, 39c. The method may comprise cooling the vessel 16 and/or radiation source SO, e.g. parts thereof, down, e.g. prior to the step (805) of operating the second access member. The method may comprise returning the interior 32 of the vessel 16 to atmospheric pressure, e.g. prior to operating the second access member. The method may comprise disconnecting the coolant source from the plurality of connection elements 48, which may be part of the second access member, e.g. prior to the step (805) of operating the second access member 38.

In step 810, the method comprises removing the collector to be exchanged. The step of removing the collector 5 to be exchanged may comprise disconnecting the collector 5 from the debris mitigation system 24. The step of removing the collector 5 may comprise passing the collector 5 to be exchanged through the second opening 36. The method may comprise removing the second fuel collector to be exchanged, e.g. subsequent to the step of removing the collector 5. The method may comprise passing the second fuel collector to be exchanged through the second opening 36.

In step 815, the method comprises installing a collector to be used. The collector to be used may comprise a fresh, cleaned, serviced or new collector. The method may comprise installing a second fuel collector to be used, e.g. prior to installing the collector to be used. The second fuel collector to be used may comprise a fresh, cleaned, serviced or new second fuel collector.

In step 820, the method comprises operating the second access member 38 to prevent access to the interior of the vessel through the second opening. The step of operating the second access member to prevent access may comprise operating the vessel 16 from the second open configuration, as shown in FIG. 3C, to the closed configuration, as shown in FIG. 3A. The step (820) of operating the second access member 38 to prevent access may comprise inserting the further fasteners 39e into the further bores 39c, 39d and/or fastening the fasteners 39e. The method may comprise heating of the vessel 16 and/or radiation source SO, e.g. parts thereof, e.g. subsequent to the step (820) of operating the second access member 38 to prevent access. The method may comprise decreasing a pressure in the interior 32 of the vessel 16 to well below atmospheric pressure, e.g. subsequent to the step (820) of operating the second access member 38 to prevent access. The method may comprise connecting the coolant source to the plurality of connection elements 48, which may be part of the second access member, e.g. subsequent to the step (820) of operating the second access member 38 to prevent access.

It will be appreciate that any of the method step described in relation to FIGS. 6 and 6 may be used in combination with each other or in isolation of each other.

It will be appreciated that any steps of the method described above may also be applied to a radiation source SO comprising the vessel 116 shown in FIGS. 5A and 5B. The method may then comprise operating the access member 134 to allow access to the interior 132 of the vessel 116 through the opening 130. The step of operating the access member 134 may comprise operating the vessel 116 from the closed configuration, as shown in FIG. 5A, to the open configuration, as shown in FIG. 5B. The step of operating the access member 134 may comprise unfastening and/or removing the fasteners 139 from the bores 139a, 139b. The method may comprise cooling the vessel 116 and/or radiation source SO, e.g. parts thereof, down, e.g. prior to the step of operating the access member. The method may comprise returning the interior 132 of the vessel 116 to atmospheric pressure, e.g. prior to operating the access member 134. The method may comprise disconnecting the coolant source from the plurality of connection elements 148, which may be part of the access member 134, e.g. prior to the step of operating the access member 134.

The method may comprise removing the contamination trap 126a to be exchanged. The step of removing the contamination trap 126a to be exchanged may comprise disconnecting the contamination trap 126a from at least another part of the debris mitigation system 124 and the gas flow device 126f. The step of removing the contamination trap 126a may comprise passing the contamination trap 126a to be exchanged through the first opening 130.

Additionally or alternatively, the method may comprise the removing the collector to be exchanged. The step of removing the collector 105 to be exchanged may comprise disconnecting the collector 105 from the debris mitigation system 124. The step of removing the collector 105 may comprise passing the collector 105 to be exchanged through the opening 130. The method may comprise removing the second fuel collector to be exchanged, e.g. subsequent to the step of removing the collector 105. The method may comprise passing the second fuel collector to be exchanged through the opening 130.

The method may comprise installing a contamination trap and/or collector to be used. The contamination trap to be used may comprise a fresh, cleaned, serviced or new contamination trap. The collector to be used may comprise a fresh, cleaned, serviced or new collector. The method may comprise installing a second fuel collector to be used, e.g. prior to installing the collector and/or the contamination trap to be used. The second fuel collector to be used may comprise a fresh, cleaned, serviced or new second fuel collector.

The method may comprise operating the access member 134 to prevent access to the interior 132 of the vessel 116 through the opening 130. The step of operating the access member 134 to prevent access may comprise operating the vessel 116 from the open configuration, as shown in FIG. 6B, to the closed configuration, as shown in FIG. 6A. The step of operating the access member 134 to prevent access may comprise inserting the fasteners 139 into the bores 139*a*, 139*b* and/or fastening the fasteners 139. The method may comprise heating of the vessel 116 and/or radiation source SO, e.g. parts thereof, e.g. subsequent to the step of operating the access member 134 to prevent access. The method may comprise decreasing a pressure in the interior of the vessel 116 to well below atmospheric pressure, e.g. subsequent to the step of operating the access member 134 to prevent access. The method may comprise connecting the coolant source to the plurality of connection elements 148, which may be part of the access member 134, e.g. subsequent to the step of operating the access member 134 to prevent access.

It will be understood that the terms "EUV radiation source" and "radiation source" may be interchangeably used.

It will be understood that references to a plurality of features may be interchangeably used with references to singular forms of those features, such as for example "at least one" and/or "each". Singular forms of a feature, such as for example "at least one" or "each," may be used interchangeably.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A vessel configured to house an EUV radiation source system, the vessel comprising:
    a first opening configured to allow a user to access the radiation source system in an interior of the vessel;
    a first access member configured to allow or prevent access to the interior of the vessel through the first opening;
    a second opening configured to allow the user to access a radiation source system in the interior of the vessel, wherein the second opening is configured in the first access member; and
    a second access member located on the first access member and configured to allow or prevent access to the interior of the vessel through the second opening.

2. The vessel of claim 1, wherein the first opening is configured to allow access to a first component and a second component of the radiation source system and to allow passage of the first and/or second components of the radiation source system through the first opening, wherein the first and/or second component comprise a debris mitigation system, an optical component, a metrology module, and/or an inspection apparatus.

3. The vessel of claim 2, wherein the second opening is configured to allow access to the second component of the radiation source system and to allow passage of the second component of the radiation source system through the second opening, wherein the second component comprises a debris mitigation system, an optical component, a metrology module, and/or an inspection apparatus.

4. The vessel of claim 1, wherein the vessel is operable between at least two of a closed configuration, a first open configuration, and a second open configuration.

5. The vessel of claim 4, wherein:
    in the closed configuration of the vessel, the first and second access members are configured to prevent access to the interior of the vessel,
    in the first open configuration of the vessel, the first access member is configured to allow access to the interior of the vessel through the first opening, and/or
    in the second open configuration of the vessel, the second access member is configured to allow access to the interior of the vessel through the second opening.

6. The vessel of claim 1, wherein the vessel comprises a mounting portion for mounting one or more metrology modules or inspection apparatuses to the vessel, the mounting portion being part of or comprised in the first access member.

7. The vessel of claim 6, wherein the mounting portion is configured to mount the one or more metrology modules or inspection apparatuses relative to a reference point in the interior of the vessel.

8. The vessel of claim 6, wherein the second access member is configured separately from the mounting portion and/or below the mounting portion.

9. An EUV radiation source comprising:
    a vessel configured to house an EUV radiation source system, the vessel comprising:
        a first opening configured to allow a user to access an interior of the vessel;

a first access member configured to allow or prevent access to the interior of the vessel through the first opening;

a second opening configured to allow the user to access the interior of the vessel, wherein the second opening is configured in the first access member; and a second access member located on the first access member and configured to allow or prevent access to the interior of the vessel through the second opening.

10. The radiation source of claim 9, wherein the radiation source system comprises a debris mitigation system, the debris mitigation system being configured to be modular.

11. The radiation source of claim 10, wherein a first component of the radiation source system comprises at least a part or all of the debris mitigation system of the radiation source.

12. The radiation source of claim 9, wherein a second component of the radiation source system comprises at least one of:
 - a collector mirror configured for collecting radiation emitted at a plasma formation region of the radiation source; and
 - a fuel collector configured for collecting fuel debris generated at the plasma formation region of the radiation source.

13. A lithographic system comprising:
an EUV radiation source comprising:
a vessel configured to house an EUV radiation source system, the vessel comprising:
 - a first opening configured to allow a user to access an interior of the vessel;
 - a first access member configured to allow or prevent access to the interior of the vessel through the first opening;
 - a second opening configured to allow the user to access the interior of the vessel, wherein the second opening is configured in the first access member; and
 - a second access member located on the first access member and configured to allow or prevent access to the interior of the vessel through the second opening; and
a lithographic apparatus.

14. A method comprising:
exchanging at least a first component of an EUV radiation source, the radiation source comprising a vessel for housing an EUV radiation source system, the vessel comprising:
 - a first opening for accessing an interior of the vessel;
 - a first access member configured to allow or prevent access to the interior of the vessel through the first opening;
 - a second opening for accessing the interior of the vessel, wherein the second opening is configured in the first access member; and
 - a second access member located on the first access member and configured to allow or prevent access to the interior of the vessel through the second opening;
operating the first access member to allow access to the interior of the vessel through the first opening;
removing at least the first component to be exchanged;
installing at least another first component to be used; and
operating the first access member to prevent access to the interior of the vessel through the first opening.

15. A method comprising:
exchanging a second component of an EUV radiation source, the radiation source comprising a vessel for housing an EUV radiation source system, the vessel comprising:
 - a first opening for accessing an interior of the vessel;
 - a first access member configured to allow or prevent access to the interior of the vessel through the first opening;
 - a second opening for accessing the interior of the vessel, wherein the second opening is configured in the first access member; and
 - a second access member located on the first access member and configured to allow or prevent access to the interior of the vessel through the second opening;
operating the second access member to allow access to the interior of the vessel through the second opening;
removing the second component to be exchanged;
installing another second component to be used; and
operating the second access member to prevent access to the interior of the vessel through the second opening.

* * * * *